United States Patent
Franosch et al.

(10) Patent No.: US 7,064,360 B2
(45) Date of Patent: Jun. 20, 2006

(54) BIPOLAR TRANSISTOR AND METHOD FOR FABRICATING IT

(75) Inventors: Martin Franosch, München (DE); Thomas Meister, Taufkirchen (DE); Herbert Schaefer, Höhenkirchen-Siegertsbrunn (DE); Reinhard Stengl, Stadtbergen (DE)

(73) Assignee: Infineon Technologies AG, Munich (DE)

( * ) Notice: Subject to any disclaimer, the term of this patent is extended or adjusted under 35 U.S.C. 154(b) by 67 days.

(21) Appl. No.: 10/470,816

(22) PCT Filed: Feb. 4, 2002

(86) PCT No.: PCT/EP02/01125

§ 371 (c)(1),
(2), (4) Date: Dec. 22, 2003

(87) PCT Pub. No.: WO02/061843

PCT Pub. Date: Aug. 8, 2002

(65) Prior Publication Data

US 2004/0099881 A1    May 27, 2004

(30) Foreign Application Priority Data

Feb. 2, 2001    (DE)   ............... 101 04 776

(51) Int. Cl.
*H01L 31/0328*    (2006.01)

(52) U.S. Cl. .................. 257/197; 257/201; 438/312

(58) Field of Classification Search .............. 257/65, 257/565, 592, 591; 438/309, 320, 321, 364, 438/365, 366, 312, 313, 318

See application file for complete search history.

(56) References Cited

U.S. PATENT DOCUMENTS

| | | | | |
|---|---|---|---|---|
| 4,619,036 | A | * | 10/1986 | Havemann et al. ......... 438/334 |
| 5,250,448 | A | | 10/1993 | Hamasaki et al. |
| 5,344,786 | A | | 9/1994 | Bayraktaroglu |
| 5,411,632 | A | | 5/1995 | Delage et al. |
| 5,424,227 | A | * | 6/1995 | Dietrich et al. ............. 438/320 |
| 5,459,084 | A | | 10/1995 | Ryum et al. |
| 5,583,059 | A | * | 12/1996 | Burghartz .................. 438/319 |
| 5,587,327 | A | * | 12/1996 | Konig et al. ................ 438/312 |
| 5,614,423 | A | | 3/1997 | Matsuoka et al. |
| 5,620,907 | A | | 4/1997 | Jalali-Farahani et al. |
| 5,624,853 | A | | 4/1997 | Shikata |
| 5,821,149 | A | * | 10/1998 | Schuppen et al. .......... 438/312 |

FOREIGN PATENT DOCUMENTS

EP    0 430 279    6/1991

(Continued)

OTHER PUBLICATIONS

GaAs/(Ga,Al)As Heterojunction Bipolar Transistors with Buried Oxygen-Implanted Isolation Layers, Asbeck et al 1984 IEEE Electron Device Let, vol. 5 No. 8,Aug.

(Continued)

*Primary Examiner*—Tuan H. Nguyen
(74) *Attorney, Agent, or Firm*—Schiff Hardin LLP

(57) ABSTRACT

A method is provided to fabricate a bipolar transistor with a low base connection resistance, low defect density and improved scalability. Scalability is to be understood in this case as both the lateral scaling of the emitter window and the vertical scaling of the base width (low temperature budget). The temperature budget can be kept low in the base region since no implantations are required in order to reduce the base connection resistance. Furthermore, the difficulties associated with the point defects are largely avoided.

21 Claims, 8 Drawing Sheets

FOREIGN PATENT DOCUMENTS

| | | |
|---|---|---|
| EP | 0 592 765 | 4/1994 |
| EP | 0 607 836 | 7/1994 |
| EP | 0 684 639 | 11/1995 |
| EP | 0 810 646 | 12/1997 |
| EP | 0 818 810 | 1/1998 |

OTHER PUBLICATIONS

8030 Electronics Letters, 25 (1989) Feb. 2, No. 3 Stevenage Herts.

IBM Technical Disclosure Bulletin—vol. 34 No. 7B Dec. 1991.

Integratable and Low Base Resistance etc. King et al 1995 IEEE.

8093 IEEE Transactions on Electron Devices 42(1995) Mar.,No. 3, NY.

SiGe Base Bipolar Technology with 74 Ghzfmaxand 11 ps Gate D elay Meister et al.

Solid-State Electronics, vol. 41, No. 8 pp. 1105-1110 1997.

1997 IEEE A novel self-aligned SiGe HBT structure using selective etc. Schiz et al.

Applied Physics Letters, vol. 75, No. 9 39 Aug. 1999.

\* cited by examiner

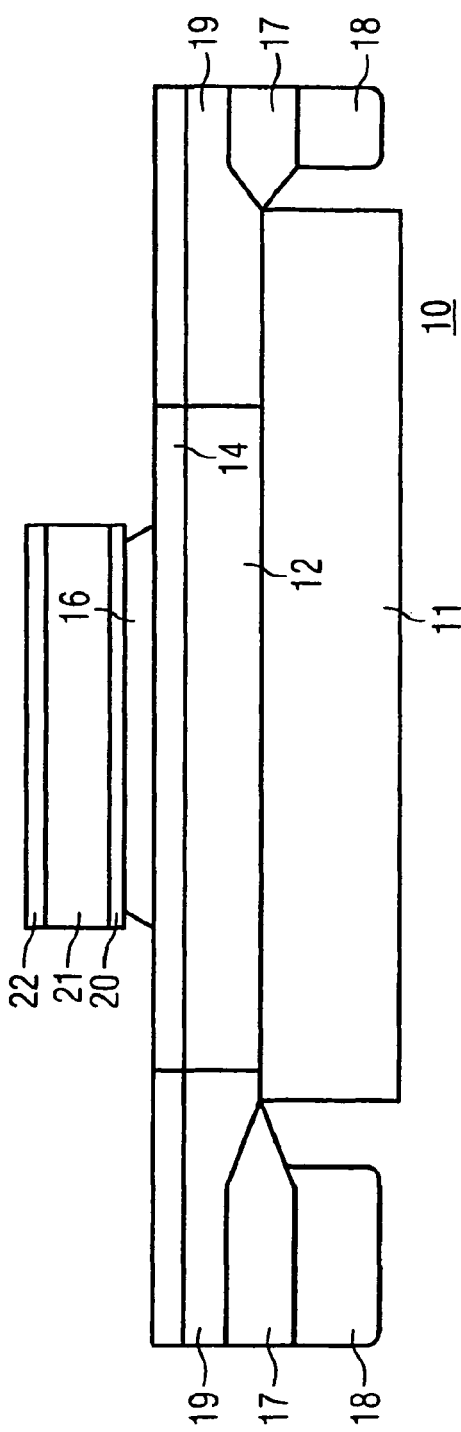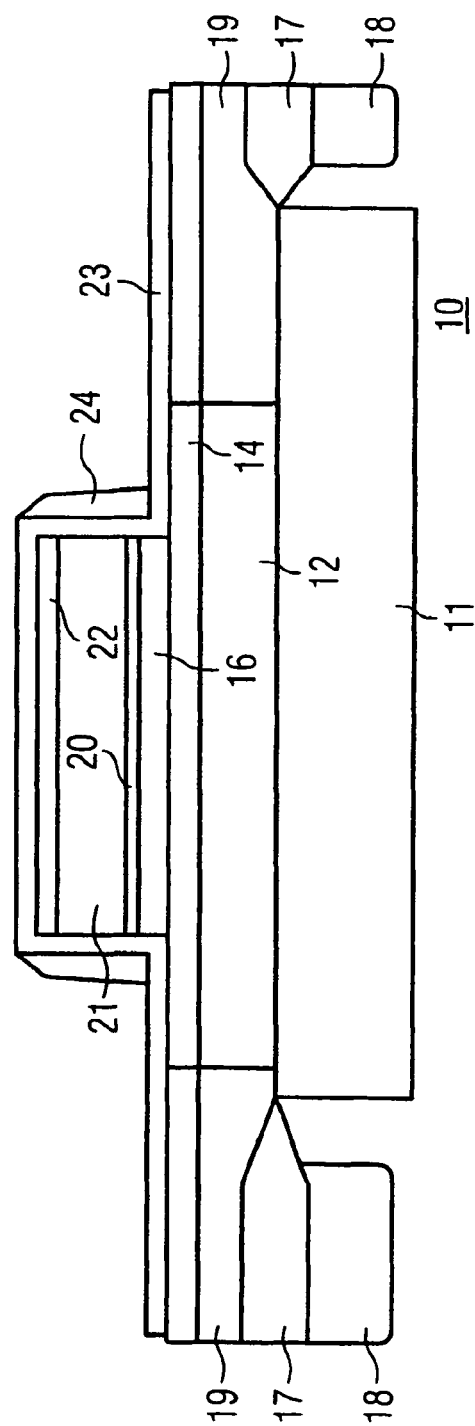

BIPOLAR TRANSISTOR AND METHOD FOR FABRICATING IT

BACKGROUND OF THE INVENTION

The present invention relates to a bipolar transistor. Furthermore, the invention relates to a method for fabricating a bipolar transistor.

Bipolar transistors are generally constructed from two pn junctions lying close together in a semiconductor crystal. In this case, either two n-doped regions are isolated from one another by a p-doped region (so-called npn transistors) or two p-doped regions are isolated from one another by an n-doped region (pnp transistors). The three differently doped regions are designated as emitter (E), base (B) and collector (C). Bipolar transistors have already been known for a long time and are used in manifold ways. A distinction is made between so-called individual transistors, which are intended for mounting on printed circuit boards or the like and are accommodated in their own housing, and so-called integrated transistors, which are fabricated together with further semiconductor components on a common semiconductor carrier, generally designated as a substrate.

The maximum oscillation frequency $f_{max}$ of a bipolar transistor is proportional to the root of $f_T$ divided by $8\pi R_B C_{BC}$, where $R_B$ is the base resistance, $C_{BC}$ is the base-collector capacitance and $f_T$ is the transition frequency. In order to obtain high oscillation frequencies, it is desirable, therefore, to reduce the base resistance. The base resistance of a bipolar transistor is determined both by the resistance of the connection region and by the sheet resistance of the base doping profile. This sheet resistance, the so-called pinch resistance, is inversely proportional to the base thickness given homogenous base doping. However, an increase in the base thickness leads to lengthening of the base transit time for the minority carriers.

An increase in the homogeneous base doping above $5 \times 10^{18}$ reduces the breakdown voltage of the emitter-base junction to excessively low values and simultaneously increases the capacitance of the base-emitter depletion layer. A known method for further reducing the base pinch resistance is the use of a lightly doped ($1 \times 10^{18}$), epitaxial emitter. The light emitter doping allows the base to be doped practically up to $1 \times 10^{20}$ without the blocking capability of the emitter-base junction being lost. Owing to the increased base charge compared with the emitter, the current gain of such a transistor would be too low, but this can be compensated for by the use of germanium in the base.

Previous concepts for producing structures with an epitaxial emitter are illustrated and described for example in Behammer et al., Solid State Electronics Vol. 41, No. 8, pp. 1105–1110 (1997) or J. Schiz et al. IEEE (1997), ISBN 7803-4135-X, pp. 255–260.

FIG. 1 diagrammatically shows a bipolar transistor in accordance with the publication by Behammer et al. in a simplified manner. The bipolar transistor first of all has a collector 102, which is formed in a silicon substrate or in a silicon epitaxial layer. The SiGe base 104 (p-doped) is provided on the collector 102 (n-doped) and the n type emitter 106 is provided on the base 104. A p+-type implantation 108 is arranged in a manner laterally adjoining the collector 102, the base 104 and the n-type emitter 106, the implantation producing the contact to the p-doped base. For the connection of the p+-type implantation 108, a metal layer 110 is provided, which is insulated from an n+-type emitter 114 by a so-called sidewall spacer 112. The n+-type emitter 114 in turn is arranged above the n-type emitter 106. The entire bipolar transistor is insulated from further components by an insulation 116 and an insulation layer 118.

In accordance with the publication by Behammer et al., the bipolar transistor shown in FIG. 1 can be fabricated with the aid of the so-called "blanket epitaxy". In this method, however, dry etching is affected on the base connection region.

FIG. 2 diagrammatically shows a bipolar transistor in accordance with the publication by J. Schiz et al. in a simplified manner. The bipolar transistor 100 likewise has a collector 102 which is formed in a silicon substrate or in a silicon epitaxial layer. The SiGe base 104 (p-doped) is provided on the collector 102 (n-doped) and the n−-type emitter 106 is provided on the base 104. A p+-doped polysilicon layer 120 is arranged in a manner laterally adjoining the base 104 and the n−-type emitter 106, the polysilicon layer producing the contact to the p-doped base. An n+-type emitter 114 bounded by an aligned sidewall spacer 122 is arranged above the n−-type emitter 106. The entire bipolar transistor is again insulated from further components by an insulation 116 and an insulation layer 118.

The bipolar transistor in accordance with the publication by J. Schiz et al. has to produce the sidewall spacer 122 by means of a phototechnology, with the result that a thickness of less than 200 μm is generally not possible. However, such a thick sidewall spacer 122 results in significantly increased parasitic capacitances.

A common feature shared by the bipolar transistors shown in FIGS. 1 and 2 is that a so-called "link implantation" (contact implantation) is carried out outside the emitter region in order to reduce the base connection resistance. In a further publication by Harame et al., Trans. ED Vol. 42, No. 3, pp. 469–482, FIG. 3 therein illustrates the implantation damage, point defects, which are generally produced in the case of such implantation, and also in the case of dry etching on the silicon substrate.

Even assuming that the point defects are not extended into the active base region, the point defects present nonetheless lead to an abnormally high diffusion of the dopant boron into the nearby SiGe base 104. In order to prevent such dopant diffusion, the sidewall spacer cannot be made arbitrarily thin. In order to keep the point defects away from the base, a sidewall spacer of approximately 150 nm or larger is necessary, which, however, increases the link resistance and the base collector capacitance. For the case where the sidewall spacer is completely omitted and the implantation is additionally effected into the connection region, a functioning component cannot be expected. Furthermore, the base profile is greatly widened during subsequent temperature steps above 550 C on account of the point defects still present.

SUMMARY OF THE INVENTION

An object of the present invention, therefore, is to provide a bipolar transistor and also a method for fabricating it which significantly reduces or completely avoids the difficulties outlined. In particular, the object of the present invention is to provide a bipolar transistor which has a low base connection resistance and also a low defect density.

According to the invention, a method is provided for fabricating the bipolar transistor wherein a semiconductor substrate is provided with a collector, a base, and a lightly doped emitter layer. A mask is applied to the lightly doped emitter layer. The lightly doped emitter layer is etched—chemically with aid of a mask to form a lightly doped emitter and to form an uncovered region of the base. The base connection is formed on the uncovered base region. The mask is removed and a highly doped emitter is formed.

In a bipolar transistor of the invention, a semiconductor substrate is provided with a collector, a base, a lightly doped emitter, and a highly doped emitter thereon. The connection to the base is oriented substantially parallel to the lightly doped emitter, is isolated from the lightly doped emitter by at least one of a sidewall spacer and a pn junction, and the connection to the base is provided in a region on the base.

DESCRIPTION OF THE DRAWINGS

FIGS. 3 to 11 show a diagrammatic illustration of a first embodiment of the method.

DESCRIPTION OF THE PREFERRED EMBODIMENT

Figure 15:
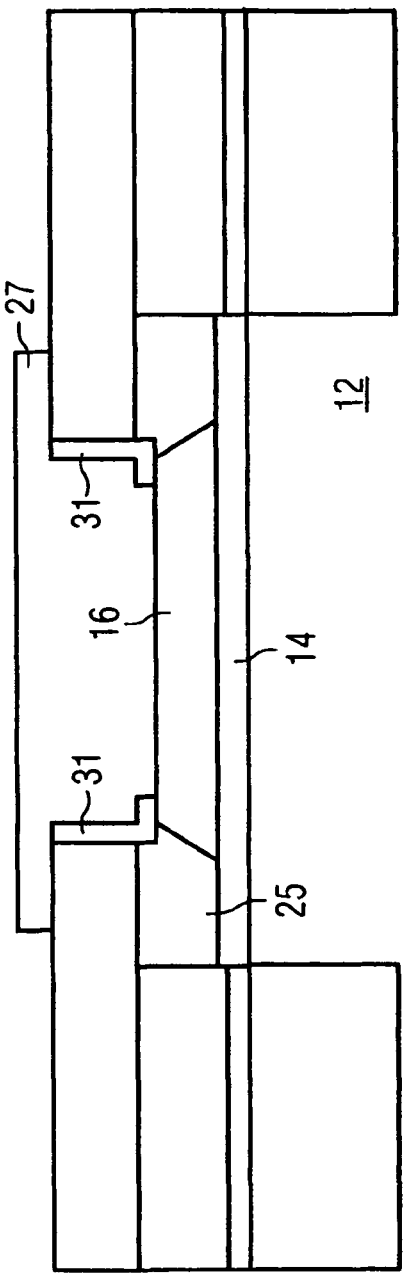
FIGS. 12 to 15 show a diagrammatic illustration of a second embodiment of the method.

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

A method is provided for fabricating a bipolar transistor, in particular an npn bipolar transistor, having the following steps:
a) a semiconductor substrate with a collector, a base and a lightly doped emitter layer is provided;
b) a mask is applied to the lightly doped emitter layer;
c) the lightly doped emitter layer is etched wet-chemically with the aid of the mask, thereby forming a lightly doped emitter;
d) the base connection is formed on the uncovered regions of the base; and
e) the mask is removed and a highly doped emitter is formed.

Furthermore, a bipolar transistor is provided, in particular an npn bipolar transistor, with a semiconductor substrate, a collector, a base, a lightly doped emitter and a highly doped emitter. The bipolar transistor in that the connection to the base is oriented essentially parallel to the lightly doped emitter and is isolated from the lightly doped emitter by a sidewall spacer or a pn junction.

The method makes it possible to fabricate a bipolar transistor with a low base connection resistance, low defect density and improved scalability. Scalability is to be understood in this case as both the lateral scaling of the emitter window and the vertical scaling of the base width (low temperature budget). The temperature budget can be kept low in the base region since no implantations are required in order to reduce the base connection resistance. Furthermore, the difficulties associated with the point defects are largely avoided.

In accordance with one preferred embodiment, a highly doped silicon-germanium base is used as the base. The use of germanium in the base makes it possible to ensure an adequate current gain of the bipolar transistor despite an increased base charge.

The base preferably has a thickness of 20 to 50 nm and also a doping, in particular a $p^+$-type doping, of more than $2\times10^{19}$ per cubic centimeter. Furthermore, it is preferred for the lightly doped emitter to have a thickness of 50 to 150 nm and also an $n^-$-type doping of less than $2\times10^{18}$ per cubic centimeter.

In accordance with a further preferred embodiment, the mask comprises an oxide layer, a silicon layer and a nitride layer. In this case, it is preferred for the oxide layer (oxide stop layer) to be applied to the lightly doped emitter layer with the aid of a CVD method. The thickness of the stop layer is preferably 5 to 30 nm. A, preferably $p^+$-doped, amorphous silicon layer having a thickness of 100 to 1000 nm is applied to the oxide layer. The nitride layer follows, which is deposited by means of a sputtering method with a thickness of 20 to 50 nm. The combined layer comprising nitride and amorphous silicon can subsequently be patterned by photo technology to the width of the emitter window by dry etching. The oxide layer in this case serves as an etching stop, since amorphous silicon can be etched highly selectively (>10) with respect to oxide. The oxide can subsequently be removed by HF.

It is furthermore preferred for the lightly doped emitter layer to be etched wet-chemically using an alkaline etchant, in particular KOH, choline and/or ethylenediamine. Wet-chemical etching using an alkaline etchant, in particular KOH, choline and/or ethylenediamine, has the advantage that etching is affected selectively between n-type and p-type silicon. The lightly doped emitter layer can thus be patterned selectively with respect to the base. Furthermore, wet-chemical etching has the advantage that no defects are produced in the underlying base in this case.

In accordance with a further preferred embodiment, the lightly doped emitter layer is formed above the base as an essentially monocrystaline layer and the wet-chemical etching stops on (111) faces in the essentially monocrystaline layer. Wet-chemical etching using KOH or choline, in particular, has the advantage that the etching stops on (111) faces which form during undercutting along (110) edges on a (100) surface. This is also the customary flat and substrate orientation in silicon wafers.

In accordance with a further preferred embodiment, a sidewall spacer, preferably a nitride spacer, is produced before the wet-chemical etching on the side walls of the mask.

In accordance with a further preferred embodiment, a sidewall spacer, preferably a nitride spacer, is produced before the formation of the base connection on the side walls of the mask and of the lightly doped emitter. In order to avoid dry etching on the base in this case, too, first the nitride layer, preferably 5 to 50 nm, is deposited and then an oxide spacer is produced by dry etching. The nitride is then removed wet-chemically, preferably by phosphoric acid, selectively with respect to the oxide, with the result that only the regions of the nitride layer which are protected by the oxide spacer remain. If the oxide spacer is subsequently removed using HF, these regions of the nitride layer form the sidewall spacer.

In accordance with a further preferred embodiment, the base connection is formed by means of selective epitaxy on the uncovered regions of the base. In this case, it is particularly preferred for a highly doped ($>1\times10^{20}$), in particular a p+-doped, base connection to be used as the base connection. In this case, the selective epitaxy is preferably effected at approximately the temperature at which the base itself was also produced (for example approximately 800° C.). Accordingly, the doping profiles are not significantly widened in this case.

In accordance with a further preferred embodiment, a sidewall spacer, preferably a nitride spacer, is produced before the formation of the highly doped emitter on the side walls of the emitter window.

FIGS. 3 to 11 below show a diagrammatic illustration of a first embodiment of the method. In accordance with step a) of the method according to the invention, a silicon substrate 10 with a collector 12, a base 14 and a lightly doped emitter 16 is provided. In order to ensure the electrical connection of the collector 12, the collector 12 is in contact with a buried layer 11. Furthermore, an insulation 17, a LOCOS insulation in the present example, and a so-called "channel stop" 18 beneath the insulation 17 are provided in order to insulate the later bipolar transistor.

Figure 3:
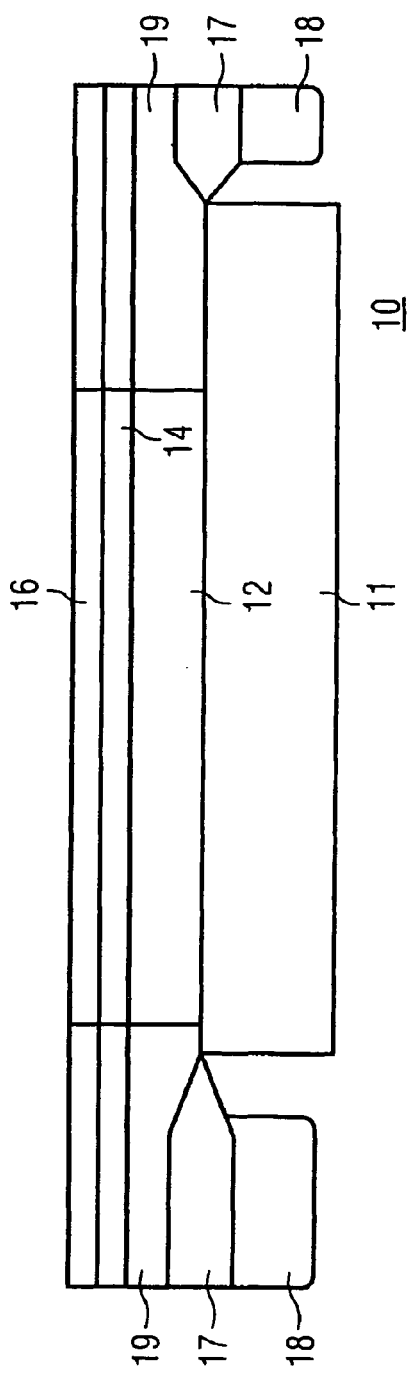
Figure 4:
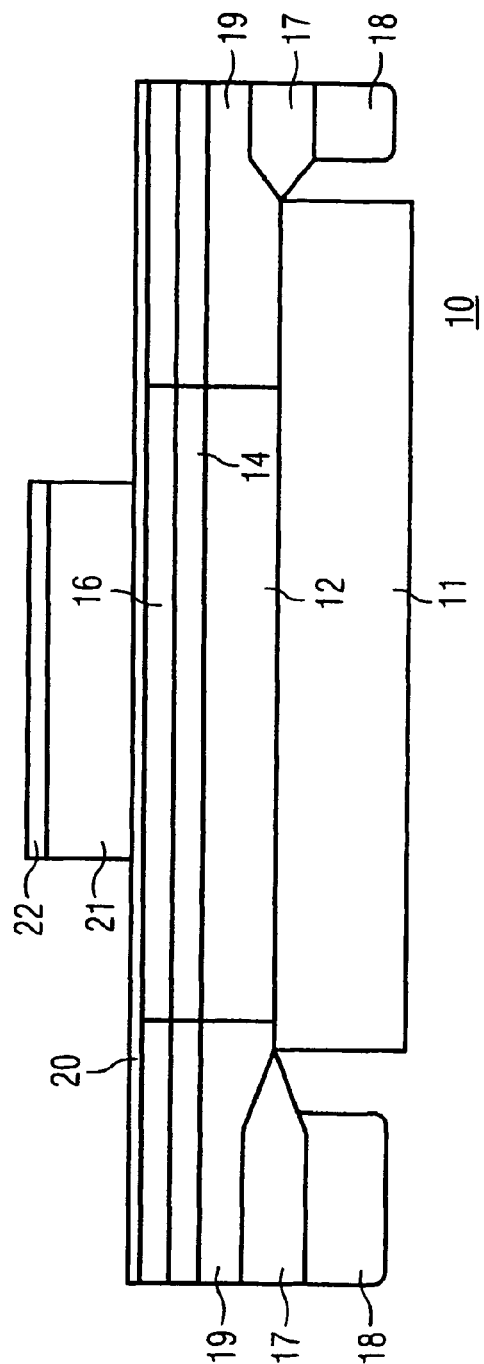
Figure 7:
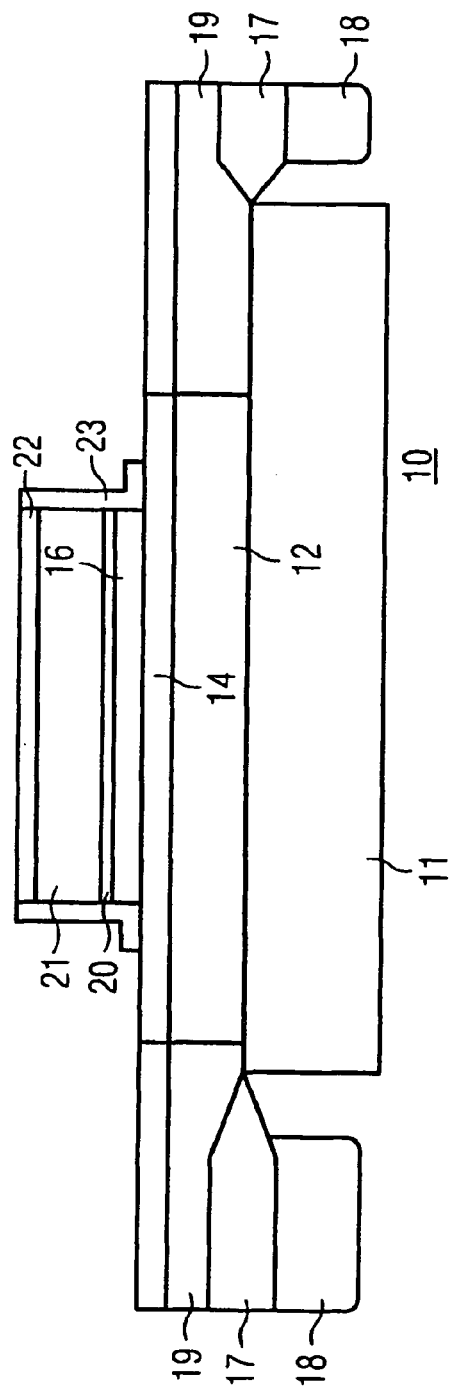

Proceeding from the silicon substrate 10 with the buried layer 11, the collector 12 is produced on the buried layer 11, for example by selective epitaxy. In this case, the collector 12 is laterally bounded by an insulation layer 19, for example a TEOS layer. Afterward, a highly doped silicon-germanium base 14 and a lightly doped emitter layer 16 are deposited, for example by differential epitaxy. The base 14 preferably has a thickness of 20 to 50 nm and also a p+-type doping of more than $2 \times 10^{19}$ per cubic centimeter. The lightly doped emitter 16 has a thickness of 50 to 150 nm and also an n−-type doping of less than $2 \times 10^{18}$ per cubic centimeter. The resultant situation is shown in FIG. 3.

A CVD oxide stop layer 20 is subsequently deposited. In this case, the thickness of the oxide stop layer 20 is between 5 and 30 nm. The deposition is effected at a temperature of 600° C., for example. A highly doped (P+) amorphous silicon layer 21 is then deposited. In this case, the thickness of the amorphous silicon layer 21 is between 100 and 1000 nm. The deposition is effected at a temperature of 550° C., for example. Furthermore, a sputtered nitride layer 22 having a thickness of about 35 nm is applied.

Figure 2:
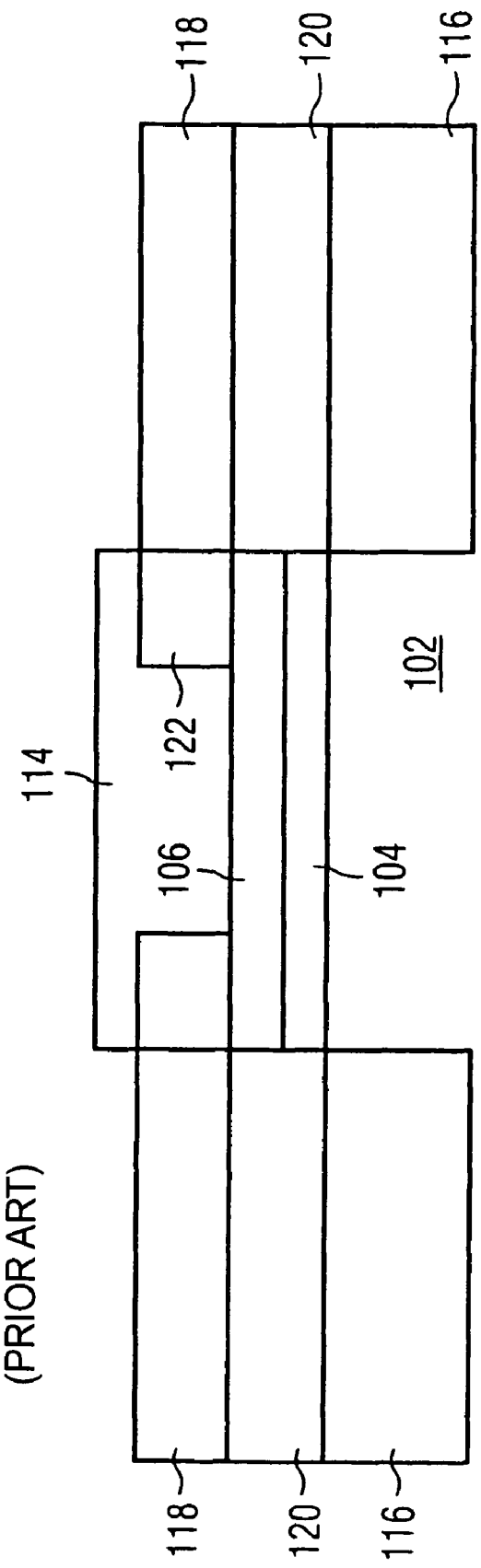
FIG. 2 diagrammatically shows a bipolar transistor in accordance with the publication by J. Schiz et al. in a simplified manner.

Afterward, the nitride layer 22 and the amorphous silicon layer 21 are patterned by phototechnology to the width of the emitter window by dry etching. The oxide layer 20 serves as an etching stop in this case, since amorphous silicon can be etched highly selectively (>10) with respect to oxide. The oxide 20 will subsequently be removed by HF. The resultant situation is shown in FIG. 2.

The method is comprised of patterning the lightly doped emitter layer 16 above the base 14 by wet etching. The layer stack comprising oxide layer 20, amorphous silicon layer 21 and nitride layer 22 in this case acts as a mask for the patterning. In this case, it is preferred for the lightly doped emitter layer 16 to be etched wet-chemically using KOH or choline. Wet-chemical etching using KOH or choline has the advantage that KOH or choline etches selectively between n-type and p-type silicon. The lightly doped emitter layer 16 can thus be patterned selectively with respect to the base 14 and the already patterned amorphous silicon layer 21. Furthermore, wet-chemical etching using KOH or choline has the advantage that no defects are produced in the underlying base 14 in this case.

Since the lightly doped emitter layer 16 is formed above the base 14 as an essentially monocrystaline layer, the wet-chemical etching using KOH or choline stops on (111) faces which form during undercutting along (110) edges on a (100) surface. This is also the customary flat and substrate orientation in silicon wafers. The lightly doped emitter 16, which is bounded laterally (up to corner regions as well) by (111) faces is formed in this way. The resultant situation is shown in FIG. 5.

The sidewall of the lightly doped emitter is then insulated by a nitride spacer 23. In order to avoid dry etching on the base 14 in this case, too, first the nitride layer 23 having a thickness of between 5 and 50 nm is deposited and then an oxide spacer 24 is patterned by oxide deposition, for example TEOS, and subsequent dry etching. The resultant situation is shown in FIG. 6. For reasons of simplicity, the (111) stop faces which laterally bound the lightly doped emitter 16 are no longer illustrated in FIG. 6 and in the following figures.

Afterward, the nitride layer 23 is removed wet-chemically, preferably by phosphoric acid, selectively with respect to the oxide 24, with the result that only the regions of the nitride layer 23 which are protected by the oxide spacer 24 remain. The oxide spacer 24 is subsequently removed using HF, with the result that said regions of the nitride layer which are protected by the oxide spacer form the sidewall spacer 23. The resultant situation is shown in FIG. 3.

Figure 8:
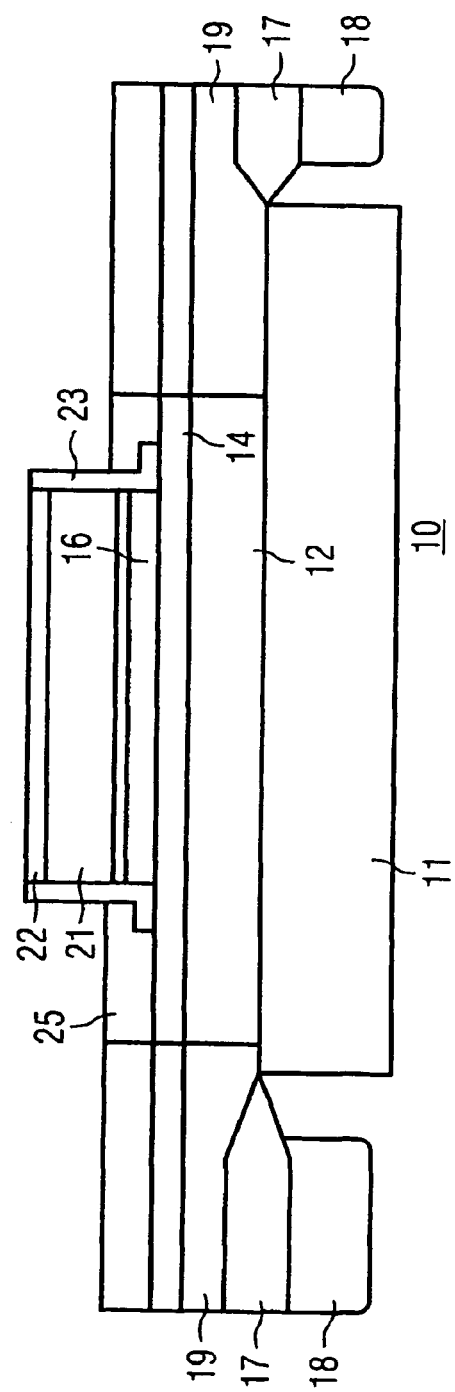

Afterward, the base connection 25 is formed by means of selective epitaxy on the uncovered regions of the base. In this case, it is particularly preferred for a highly doped (>$1 \times 10^{20}$), in particular a P+-doped, base connection 25 to be used as the base connection. In this case, the selective epitaxy is preferably effected at approximately the temperature at which the base 14 itself was also produced (for example approximately 800° C.). Accordingly, the doping profiles are not significantly widened in this case. The resultant situation is shown in FIG. 8.

The connection 25 to the base is thus oriented essentially parallel to the lightly doped emitter 16, i.e. the essential contact area with which the base 14 is in contact with the base connection 25 is oriented parallel to the contact area with which the lightly doped emitter 16 is in contact with the base 14. In this case, the base connection 25 is isolated from the lightly doped emitter by the sidewall spacer 23. Since the monocrystaline region of the base connection 25 is essentially free of defects, it is possible to make the sidewall spacer 23 very thin.

Figure 9:
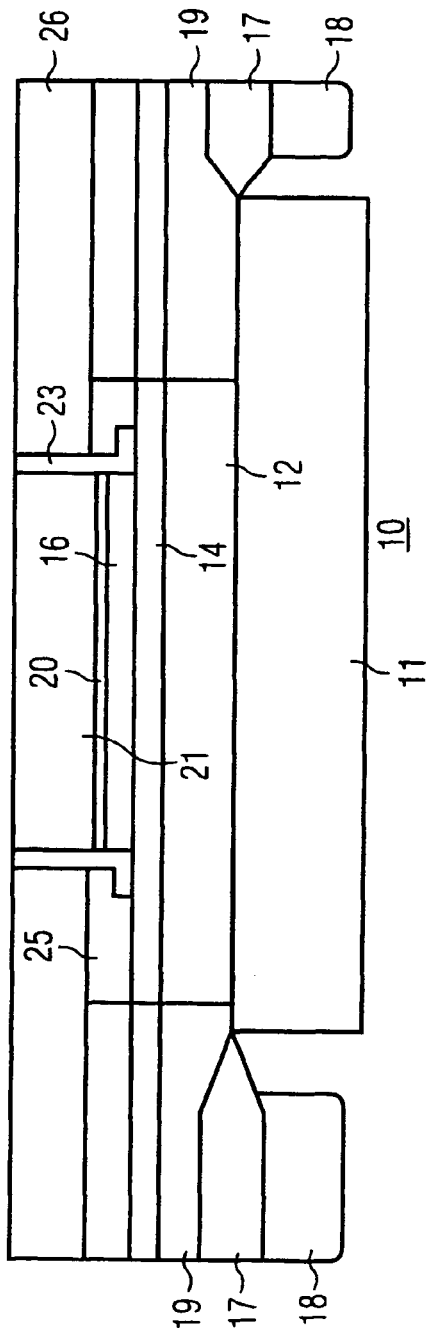
Figure 10:
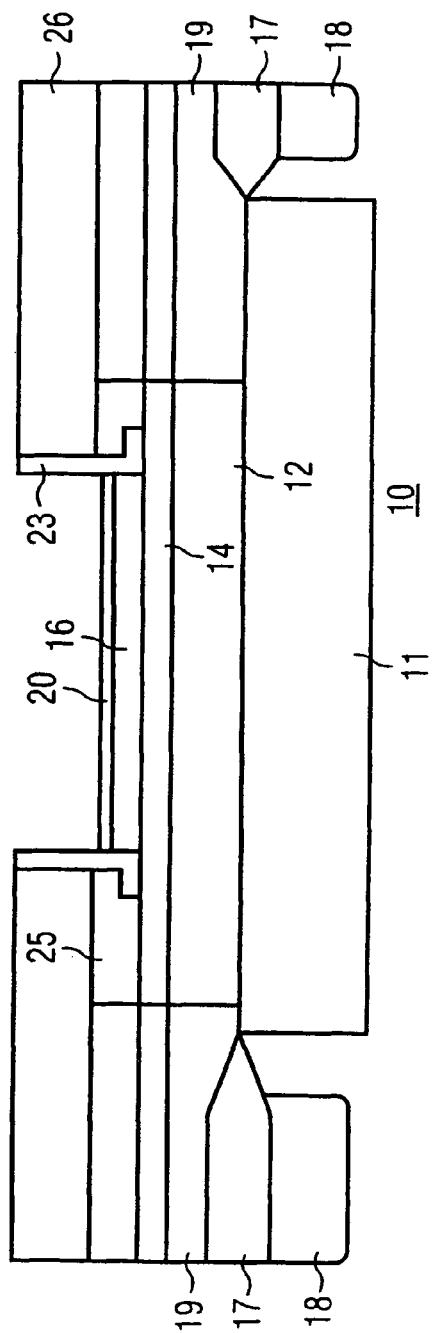

As shown in FIG. 9, a CVD oxide 26 is then deposited and planarized. In this case, the residual nitride layer 22 above the emitter window is polished away. Then this is followed by the self-aligned removal of the sacrificial layers in the emitter window. In this case, the amorphous silicon layer 21 is removed in the emitter window by dry etching, for instance CVD oxide 20 again serving as an etching stop (FIG. 10).

After the oxide layer 20 has likewise been removed by wet etching using HF, the n+ emitter poly 27 is deposited and patterned. The base contact 28 and also the collector contact 29 are subsequently produced in a customary manner. The resultant situation is shown in FIG. 11.

Figure 1:
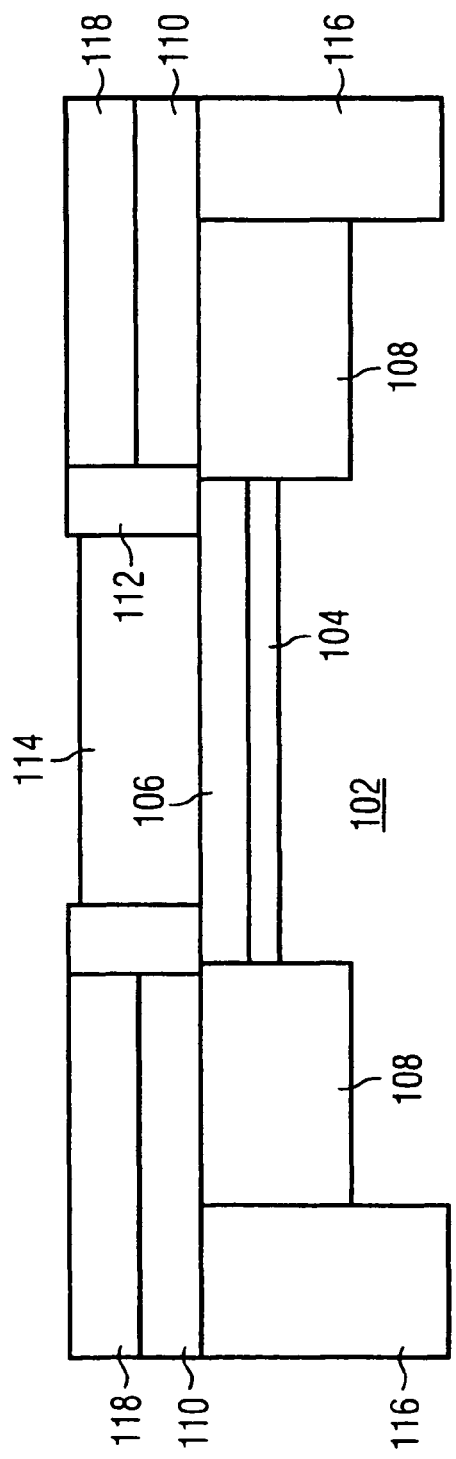
FIG. 1 diagrammatically shows a bipolar transistor in accordance with the publication by Behammer et al. in a simplified manner.
Figure 11:
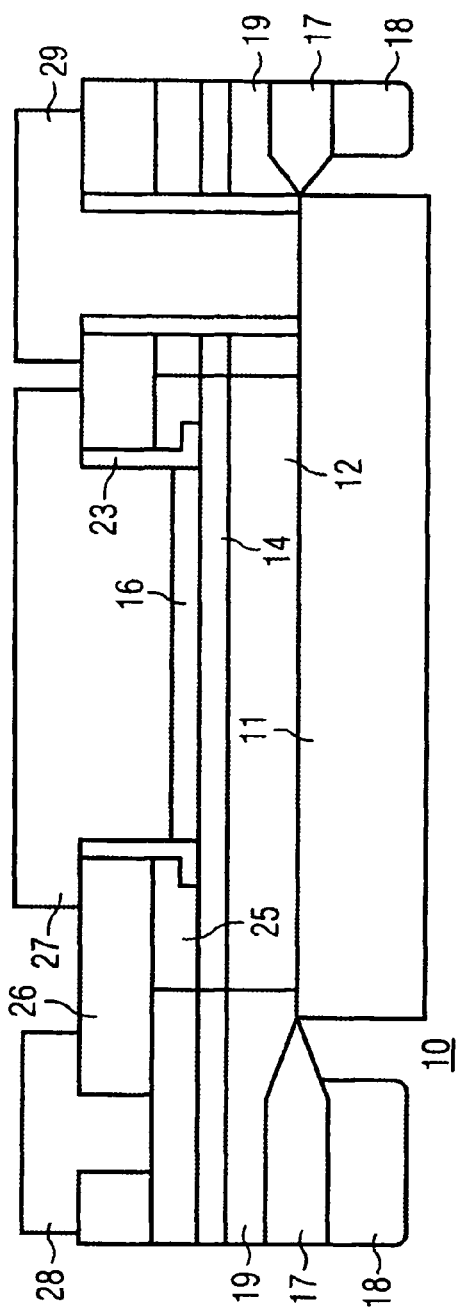

In contrast to the bipolar transistor according to the prior art as shown in FIG. 1, the bipolar transistor as shown in FIG. 11 has a sidewall spacer 23 which continues downward as far as the base and is at least partly surrounded by an essentially monocrystaline base connection 25. In the case of the bipolar transistor according to the prior art as shown in FIG. 1, the monocrystaline p+-doped region terminates level with the n-type emitter and reaches deep below the base, whereas in the case of the bipolar transistor as shown in FIG. 11, the insulation begins on the lower edge of the base and the monocrystaline region of the base connection 25 lies reliably above the upper edge of the base. Since the monocrystaline base connection 25 to the base 14 is essentially free of defects, it is possible to make the sidewall spacer 23 very thin.

FIGS. 12 to 15 below show a diagrammatic illustration of a second embodiment of the method. In this case, the first process steps of this second embodiment correspond to the process steps which have already been described in connection with FIGS. 3 and 4, so that a repetition can be dispensed with.

Figure 12:
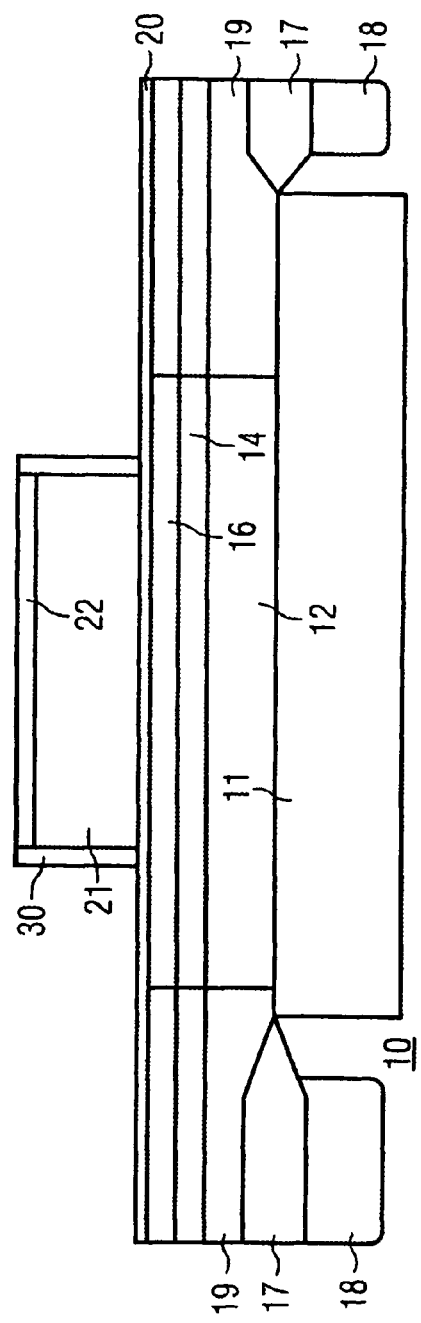

After the patterning of the nitride layer 22 and the amorphous silicon layer 21 by dry etching, a nitride spacer 30 is produced on the sidewalls of the nitride layer 22 and of the amorphous silicon layer 21. The oxide layer 20 again serves as an etching stop in this case. The resultant situation is shown in FIG. 12. Instead of a layer stack comprising silicon and silicon nitride, it is also possible to use a mask composed exclusively of silicon nitride. This would have the advantage that only two materials would need to be etched selectively with respect to one another. The oxide 20 is subsequently removed using HF.

Figure 13:
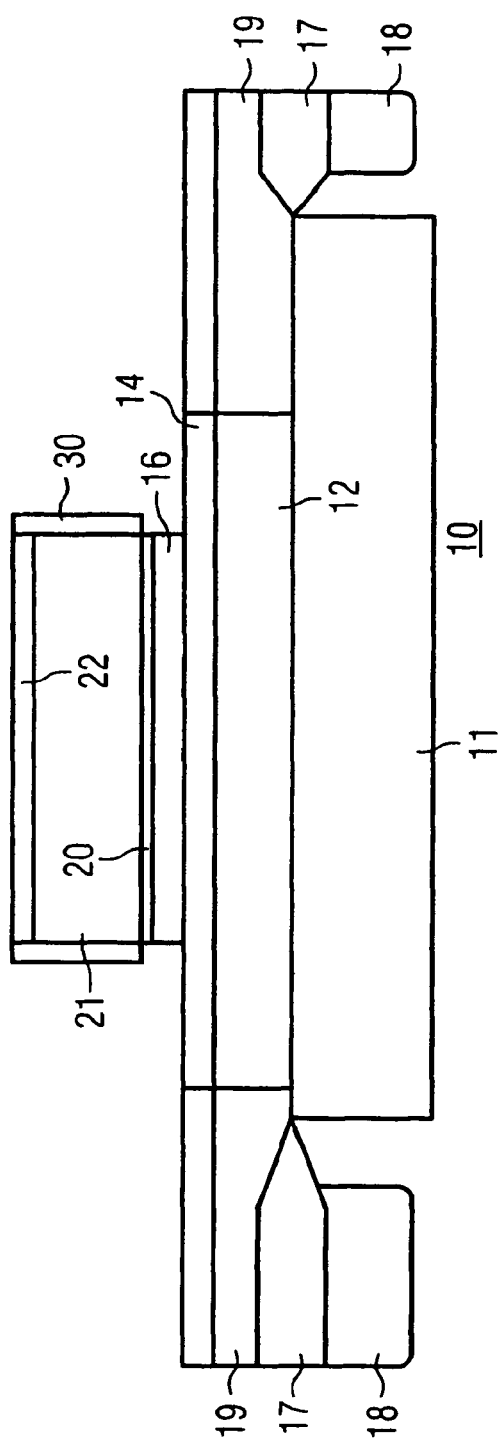

Afterward, it will be necessary to pattern the lightly doped emitter layer 16 above the base 14 by wet etching. The layer stack comprising oxide layer 20, amorphous silicon layer 21 and nitride layer 22 in this case acts as a mask for the patterning. In this case, it is again preferred for the lightly doped emitter layer 16 to be etched wet-chemically using KOH or choline. Since the lightly doped emitter layer 16 is formed above the base 14 as an essentially monocrystaline layer, the wet-chemical etching using KOH or choline stops on (111) faces which form during undercutting along (110) edges on a (100) surface. The resultant situation is shown in FIG. 13.

Afterward, the base connection 25 is formed by means of selective epitaxy on the uncovered regions of the base. In this case, it is particularly preferred for a highly doped ($>1\times10^{20}$), in particular a P+ doped, base connection 25 to be used as the base connection. The selective epitaxy is preferably effected at approximately the temperature at which the base 14 itself was also produced (for example approximately 800° C.). Accordingly, the doping profiles are not significantly widened in this case. Since, in this embodiment, the sidewall spacer 30 is not present in the region of the lightly doped emitter 16, the connection 25 to the base 14 is isolated from the lightly doped emitter 16 by a pn junction.

Figure 14:
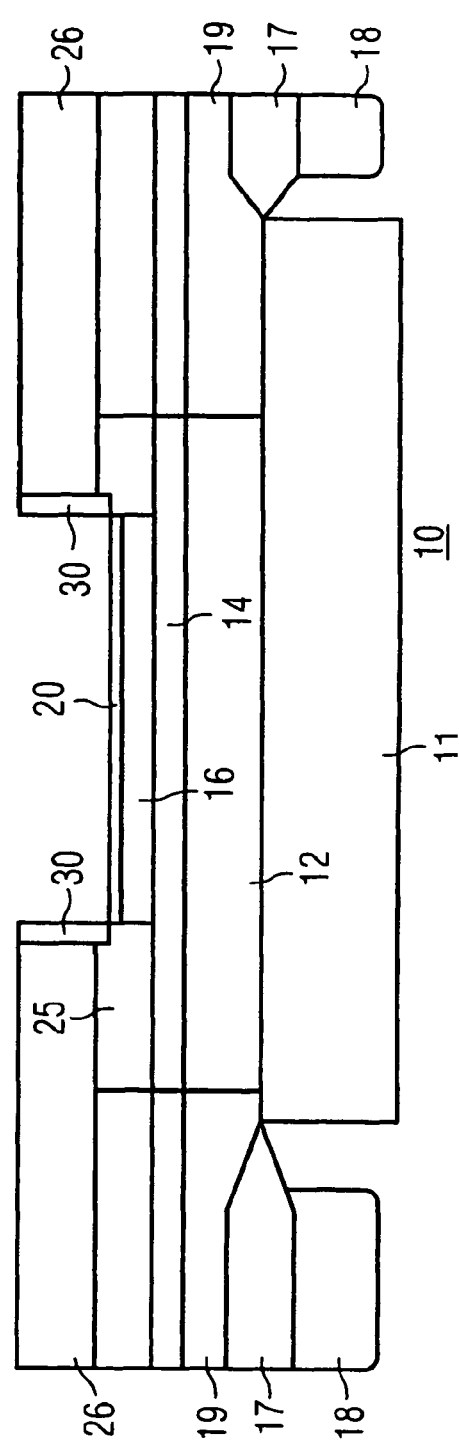

A CVD oxide 26 is subsequently deposited and planarized. In this case, the residual nitride layer 22 above the emitter window is polished away. This is followed by the self-aligned removal of the sacrificial layers in the emitter window. In this case, the amorphous silicon layer 21 is removed in the emitter window by dry etching, for instance the CVD oxide 20 again serving as an etching stop. The resultant situation is shown in FIG. 14.

A further sidewall spacer 31 (e.g. nitride spacer) is then produced in order to ensure a sufficient distance between the base connection 25 and the n+ emitter that is still to be produced. After the oxide layer 20 has likewise been removed by wet etching using HF, the n+ emitter poly 27 is deposited and patterned. The resultant situation is shown in FIG. 15.

In contrast to the bipolar transistor according to the prior art as shown in FIG. 2, in the case of the bipolar transistor as shown in FIG. 15, a part of the base connection 25 is essentially monocrystaline and forms a pn junction with the (111) stop faces of the lightly doped emitter 16. In the case of the bipolar transistor according to the prior art as shown in FIG. 2, the sidewall spacer has to be produced by a phototechnology, with the result that a thickness of less than 200 µm is generally not possible. This results in higher parasitic capacitances. In the case of the bipolar transistor as shown in FIG. 15, the inwardly directed sidewall spacer 31 can be introduced in a self-aligned manner into the emitter hole already present and can thus also be made very thin, for example thinner than 50 nm.

While a preferred embodiment has been illustrated and described in detail in the drawings and foregoing description, the same is to be considered as illustrative and not restrictive in character, it being understood that only the preferred embodiment has been shown and described and that all changes and modifications that come within the spirit of the invention both now or in the future are desired to be protected.

The invention claimed is:

1. A method for fabricating a bipolar transistor, comprising the steps of:
    providing a semiconductor substrate with a collector, a base and a lightly doped emitter layer;
    applying a mask to the lightly doped emitter layer;
    etching the lightly doped emitter layer wet-chemically with aid of the mask to form a lightly doped emitter and to form an uncovered region of the base;
    forming a base connection on at least a portion of the uncovered base region; and
    removing the mask and forming a highly doped emitter.

2. The method of claim 1 wherein a highly doped silicon-germanium is used as the base.

3. The method of claim 1 wherein the lightly doped emitter layer is etched wet-chemically using an alkaline etchant.

4. The method of claim 1 wherein a sidewall spacer is produced before the wet-chemical etching on sidewalls of the mask.

5. The method of claim 1 wherein a sidewall spacer is produced before the formation of the base connection on sidewalls of the mask and of the lightly doped emitter.

6. The method of claim 1 wherein a sidewall spacer is produced before the formation of the highly doped emitter on sidewalls of a window associated with the emitter.

7. A method for fabricating a bipolar transistor, comprising the steps of:
    providing a semiconductor substrate with a collector, a base and a lightly doped emitter layer;
    applying a mask to the lightly doped emitter layer, said mask comprising an oxide layer, a silicon layer and a nitride layer;
    etching the lightly doped emitter layer wet-chemically with aid of the mask to form a lightly doped emitter and to form an uncovered region of the base;
    forming a base connection on at least a portion of the uncovered base region; and
    removing the mask and forming a highly doped emitter.

8. A method for fabricating a bipolar transistor, comprising the steps of:
    providing a semiconductor substrate with a collector, a base and a lightly doped emitter layer, said emitter layer being formed above the base as a substantially monocrystalline layer;
    applying a mask to the lightly doped emitter layer;
    etching the lightly doped emitter layer wet-chemically with aid of the mask to form a lightly doped emitter and to form an uncovered region of the base, the wet chemical etching stopping on faces (111) in said substantially monocrystalline layer;

forming a base connection on at least a portion of the uncovered base region; and removing the mask and forming a highly doped emitter.

9. A method for fabricating a bipolar transistor, comprising the steps of:

providing a semiconductor substrate with a collector, a base and a lightly doped emitter layer;

applying a mask to the lightly doped emitter layer;

etching the lightly doped emitter layer wet-chemically with aid of the mask to form a lightly doped emitter and to form an uncovered region of the base the wet chemical etching stopping on faces (111) in said substantially monocrystalline layer;

forming a base connection on at least a portion of the uncovered base region, the base connection being formed by a selective epitaxy on the uncovered regions of the base; and removing the mask and forming a highly doped emitter.

10. A bipolar transistor, comprising:

a semiconductor substrate with a collector which is laterally bounded by an insulation layer, a base formed by differential epitaxy on the collector and on the insulation layer, a lightly doped emitter, a highly doped emitter and a sidewall spacer on a sidewall of the highly doped emitter therein;

an epitaxial base contact formed in a region on the base which provides a connection to the base, the connection being oriented substantially parallel to the lightly doped emitter, the epitaxial base contact being isolated from the highly doped emitter by the sidewall spacer and from the lightly doped emitter by at least one of the sidewall spacer and a pn-junction; and an upper edge of the epitaxial base contact being above a lower edge of the sidewall spacer.

11. The bipolar transistor of claim 10 wherein the base is designed as a highly doped silicon-germanium base.

12. The bipolar transistor of claim 10 wherein the base has a p+ doping of more than $2\times10^{19}$ per cubic centimeter.

13. The bipolar transistor of claim 10 wherein the lightly doped emitter has an n-doping of less than $2\times10^{18}$ per cubic centimeter.

14. The bipolar transistor of claim 10 wherein the lightly doped emitter is designed as an essentially monocrystalline layer and is laterally bounded by (111) faces.

15. The bipolar transistor of claim 10 wherein the sidewall spacer is designed as a nitride spacer.

16. The bipolar transistor of claim 10 wherein the base connection is of monocrystalline design at least in one region.

17. The bipolar transistor of claim 10 wherein the base connection is highly p+ doped.

18. The bipolar transistor of claim 10 wherein the collector is in contact with a buried layer.

19. The bipolar transistor of claim 10 wherein the transistor is an npn transistor.

20. A bipolar transistor according to claim 10 in which at least a laterally extending portion of the sidewall spacer is oriented either towards or away from the highly doped emitter.

21. A method for fabricating a bipolar transistor, comprising the steps of:

providing a semiconductor substrate with a collector, a base and a lightly doped emitter layer;

applying a mask to the lightly doped emitter layer;

etching the lightly doped emitter layer wet-chemically with aid of the mask to form a lightly doped emitter, the wet-chemical etching stopping on (111) faces of said lightly doped emitter layer and to form an uncovered region of the base;

producing a sidewall spacer on sidewalls of the mask;

forming a base connection on at least a portion of the uncovered base region; and removing the mask and forming a highly doped emitter.

* * * * *